(12) United States Patent
Tian et al.

(10) Patent No.: US 11,134,593 B2
(45) Date of Patent: Sep. 28, 2021

(54) TOUCH SUBSTRATE, MANUFACTURING METHOD THEREOF, AND TOUCH DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Jian Tian, Beijing (CN); Xiaodong Xie, Beijing (CN); Shifeng Xu, Beijing (CN); Jing Wang, Beijing (CN); Ming Zhang, Beijing (CN)

(73) Assignees: BOE Technology Group Co., Ltd., Beijing (CN); Hefei Xinsheng Optoelectronics Technology Co., Ltd., Anhui (CN)

(*) Notice: Subject to any disclaimer, the term of this patent is extended or adjusted under 35 U.S.C. 154(b) by 733 days.

(21) Appl. No.: 15/780,068

(22) PCT Filed: Nov. 29, 2017

(86) PCT No.: PCT/CN2017/113640
§ 371 (c)(1),
(2) Date: May 30, 2018

(87) PCT Pub. No.: WO2018/099404
PCT Pub. Date: Jun. 7, 2018

(65) Prior Publication Data
US 2021/0176903 A1  Jun. 10, 2021

(30) Foreign Application Priority Data
Dec. 1, 2016  (CN) .......................... 201611093958.5

(51) Int. Cl.
*H05K 9/00* (2006.01)
*G06F 3/044* (2006.01)

(52) U.S. Cl.
CPC ......... *H05K 9/0064* (2013.01); *G06F 3/0443* (2019.05); *G06F 3/0446* (2019.05);
(Continued)

(58) Field of Classification Search
None
See application file for complete search history.

(56) References Cited

U.S. PATENT DOCUMENTS

2017/0262091 A1  9/2017  Wang et al.
2017/0277320 A1*  9/2017  Choi .................... G06F 3/0446

FOREIGN PATENT DOCUMENTS

CN  102446012 A  5/2012
CN  203376735 U  1/2014
(Continued)

OTHER PUBLICATIONS

Feb. 5, 2018—(WO) International Search Report and Written Opinion Application PCT/CN2017/113640 with English Translation.

*Primary Examiner* — Duane N Taylor, Jr.
(74) *Attorney, Agent, or Firm* — Banner & Witcoff, Ltd.

(57) ABSTRACT

A touch substrate and a manufacturing method thereof are provided. The touch substrate includes a base substrate including a touch area and a light shielding area surrounding the touch area. A first ground wiring and a second ground wiring which lies in a different layer from the first ground wiring are disposed in the light shielding area. The first ground wiring includes a first terminal exposed on a surface of the touch substrate. The second ground wiring includes a second terminal exposed on the surface of the touch substrate. The first terminal and the second terminal do not overlap with each other in a direction perpendicular to the base substrate.

20 Claims, 5 Drawing Sheets

(52) U.S. Cl.
CPC .............. *G06F 2203/04103* (2013.01); *G06F 2203/04107* (2013.01); *G06F 2203/04111* (2013.01)

(56) References Cited

FOREIGN PATENT DOCUMENTS

| | | |
|---|---|---|
| CN | 204360344 U | 5/2015 |
| CN | 104866126 A | 8/2015 |
| CN | 105320337 A | 2/2016 |
| CN | 105824461 A | 8/2016 |
| CN | 106527816 A | 3/2017 |

* cited by examiner

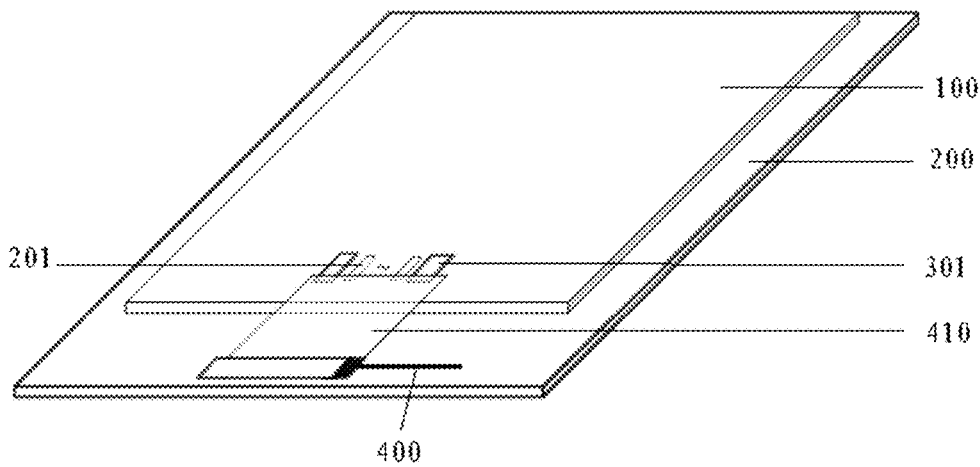

Fig. 5

| | |
|---|---|
| forming a first conductive layer on a base substrate, patterning the first conductive layer to form touch electrodes in a touch area, and forming a second ground wiring in a light shielding area; the touch electrodes comprising a first touch electrode and a second touch electrode that cross each other and are insulated from each other, the first touch electrode comprising a plurality of first sub-touch electrodes which are directly connected, and the second touch electrode comprising a plurality of second sub-touch electrodes which are arranged in a spaced-apart manner | S100 |
| forming a first insulating film, patterning the first insulating film to form a first insulating pattern between adjacent second sub-touch electrodes and forming a second insulating pattern in the light-shielding area, the second insulating pattern comprises a first hollow portion to expose a portion of the second ground wiring so as to form a second terminal of the second ground wiring | S101 |
| forming a second conductive layer, and patterning the second conductive layer so as to form bridges for connecting adjacent second sub-touch electrodes on the first insulating pattern, and forming a first ground wiring on the light shielding area and expose a second terminal | S102 |
| forming a second insulating film, and patterning the second insulating film to form a second hollow portion in the light shielding area, exposing the second terminal from the surface of the touch substrate, and exposing a portion of the first ground wiring from the surface of the touch substrate to form the first terminal; wherein the first terminal and the second terminal do not overlap with each other in a direction perpendicular to the touch substrate | S103 |

Fig. 6

TOUCH SUBSTRATE, MANUFACTURING METHOD THEREOF, AND TOUCH DISPLAY DEVICE

The application is a U.S. National Phase Entry of International Application No. PCT/CN2017/113640 filed on Nov. 29, 2017, designating the United States of America and claiming priority to Chinese Patent Application No. 201611093958.5 filed on Dec. 1, 2016. The present application claims priority to and the benefit of the above-identified applications and the above-identified applications are incorporated by reference herein in their entirety.

TECHNICAL FIELD

Embodiments of the present disclosure relate to a touch substrate and a manufacturing method thereof, and a touch display device.

BACKGROUND

In practical use of a touch display device, wirings, bridge points, and even functional areas of the touch display device are often broken down by static charges accumulation, which finally results in damage to the touch function of the touch display device and affects use of the actual functions of the product directly and seriously.

In the art known by the inventors, in order to avoid electrostatic damage, metal wirings are usually provided on the periphery of the touch display device, and the static charges of the touch display device is conducted through the peripheral metal wirings and is grounded to the earth.

SUMMARY

At least one embodiments of the present disclosure provides a touch substrate, comprising a base substrate which comprises a touch area and a light shielding area surrounding the touch area; and a first ground wiring disposed in the light shielding area of the base substrate and a second ground wiring disposed in the light shielding area and in a different layer from the first ground wiring, the first ground wiring comprising a first terminal exposed on a surface of the touch substrate, the second ground wiring comprises a second terminal exposed on the surface of the touch substrate; wherein the first terminal and the second terminal do not overlap with each other in a direction perpendicular to the base substrate.

In one embodiment of the present disclosure, touch electrodes are provided in the touch area of the base substrate, the second ground wiring and the touch electrodes are disposed on a same layer and are made of a same material.

In one embodiment of the present disclosure, the second ground wiring has a width greater than that of the first ground wiring.

In one embodiment of the present disclosure, the second ground wiring has a width of 1 to 5 mm.

In one embodiment of the present disclosure, an orthogonal projection of the second ground wiring on the base substrate surrounds an orthographic projection of the first ground wiring on the base substrate.

In one embodiment of the present disclosure, the second ground wiring comprises two second sub-ground wirings which are disconnected from each other; and the two second sub-ground wirings surround the touch area together.

In one embodiment of the present disclosure, the second ground wiring is made of transparent conductive material.

In one embodiment of the present disclosure, the touch electrodes comprise a first touch electrode and a second touch electrode that cross each other and are insulated from each other; the first touch electrode comprises a plurality of first sub-touch electrodes which are directly connected, the second touch electrode comprises a plurality of second sub-touch electrodes which are arranged in a spaced-apart manner, and the second sub-touch electrodes are connected via bridges; the bridges and the first ground wiring are disposed on a same layer and are made of a same material.

At least one embodiment of the present disclosure provides a display device, comprising any touch substrate as mentioned above.

In one embodiment of the present disclosure, the touch display device comprises a third ground wiring; the second terminal in the touch substrate is connected to the third ground wiring through a flexible printed circuit.

In one embodiment of the present disclosure, the touch display device comprises a third ground wiring; the first terminal in the touch substrate is connected to the third ground wiring through a flexible printed circuit.

At least one embodiment of the present disclosure provides a manufacturing method of a touch substrate which comprises a touch area and a light shielding area surrounding the touch area, comprising: forming a first conductive layer on a base substrate, patterning the first conductive layer to form touch electrodes in the touch area, and forming a second ground wiring in the light shielding area; the touch electrodes comprising a first touch electrode and a second touch electrode that cross with each other and are insulated from each other, the first touch electrode comprising a plurality of first sub-touch electrodes which are directly connected, and the second touch electrode comprising a plurality of second sub-touch electrodes which are arranged in a spaced-apart manner; forming a first insulating film, along a direction intersecting with the first touch electrode, patterning the first insulating film to form a first insulating pattern between adjacent second sub-touch electrodes, and forming a second insulating pattern in the light-shielding area, the second insulating pattern comprises a first hollow portion to expose a portion of the second ground wiring to form a second terminal of the second ground wiring; forming a second conductive layer, patterning the second conductive layer to form bridges for connecting adjacent second sub-touch electrodes on the first insulating pattern, and forming a first ground wiring on the light shielding area to expose the second terminal; forming a second insulating film, patterning the second insulating film to form a second hollow portion in the light shielding area, exposing the second terminal from the surface of the touch substrate, and exposing a portion of the first ground wiring from the surface of the touch substrate to form the first terminal of the first ground wiring; wherein the first terminal and the second terminal do not overlap with each other in a direction perpendicular to the touch substrate.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

FIG. 5 is an illustrative structural view of a touch display device according to one embodiment of the present disclosure;

FIG. 6 is an illustrative structural view of a manufacturing method of a touch substrate according to one embodiment of the present disclosure;

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms and scientific terms used herein should have the same meaning as commonly understood by those ordinary skilled in the art. The terms "first", "second", "third", "fourth" and similar words used in the specification and claims of the present disclosure do not denote any order, quantity, or importance, but are merely used to distinguish different components. Wordings such as "connect", "couple", or "joint" and the like are not to be limited to physical or mechanical connections, but may comprise electrical connections, either direct or indirect.

In practical using of metal wirings disposed in the periphery of the touch display device, the inventors have found that there are still many cases where the product is damaged by the static charges. The inventors analyze and draw a conclusion that the main reason may be that only through providing the peripheral metal wirings, the static charges in the touch display device may not be completely discharged, and some of the static charges may enter the touch display device. When static charges is accumulated to a certain extent, electrostatic discharge occurs, and as a result, defects such as damage to the bridge point or breakdown of the functional area occur.

Figure 1:
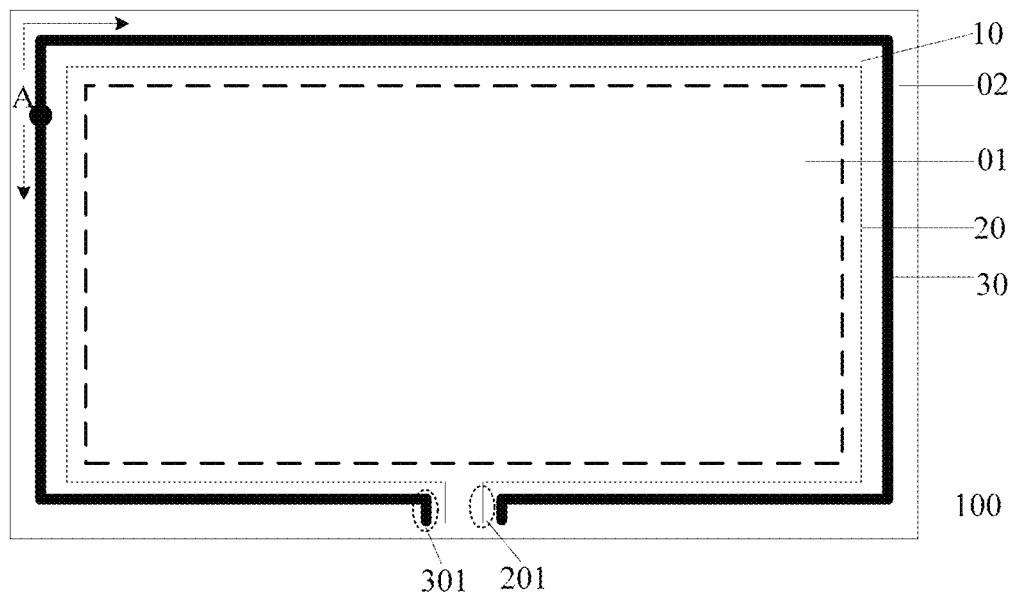
FIG. 1 is an illustrative structural view of a touch substrate according to one embodiment of the present disclosure.
Figure 2:
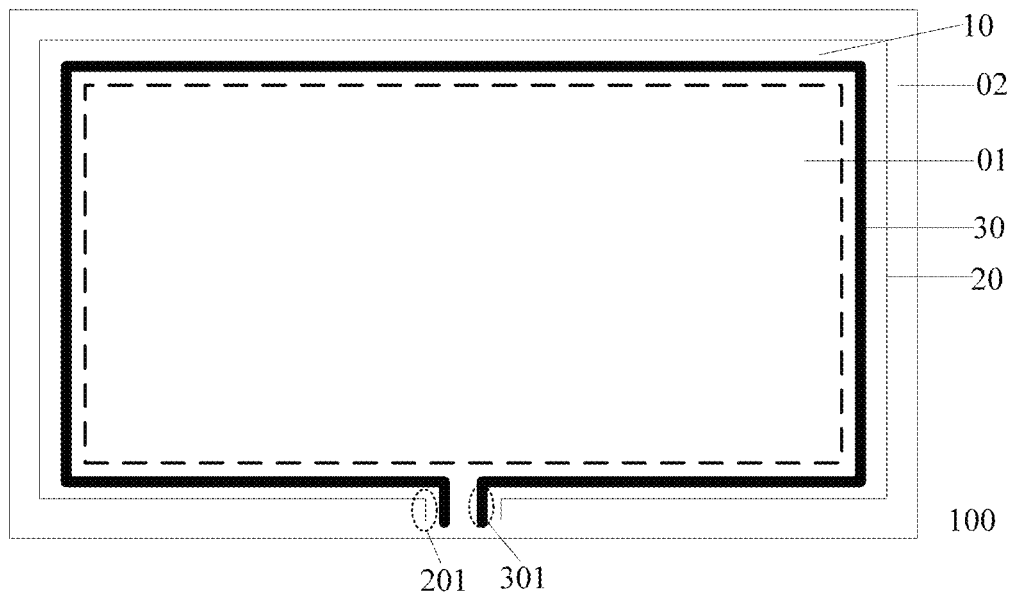
FIG. 2 is an illustrative structural view of a touch substrate according to another embodiment of the present disclosure.

At least one embodiment of the present disclosure provides a touch substrate 100. As illustrated in FIG. 1 and FIG. 2, the touch substrate 100 comprises a base substrate 10 which comprises a touch area 01 and a light shielding area 02 surrounding the touch area 01. A first ground wiring 20 and a second ground wiring 30 in a different layer from the first ground wiring 20 are provided in the light shielding area 02. The first ground wiring 20 comprises a first terminal 201 exposed on the surface of the touch substrate. The second ground wiring 30 comprises a second terminal 301 exposed on the surface of the touch substrate. The first terminal 201 and the second terminal 301 do not overlap with each other in a direction perpendicular to the base substrate 10.

Firstly, it should be noted that the materials for the first ground wiring 20 and the second ground wiring 30 are not limited as long as the first ground wiring 20 and the second ground wiring 30 can discharge the static charges on the touch substrate to the outside, that is to say, as long as they are conductive. The materials for the first ground wiring 20 and the second ground wiring 30 can be the same or different. For example, the materials for the first ground wiring 20 and the second ground wiring 30 can be a metal or a metal oxide or the like.

Secondly, the widths of the first ground wiring 20 and the second ground wiring 30 are not limited, and can be set according to the materials for the first ground wiring 20 and the second ground wiring 30. For example, the first ground wiring 20 and the second ground wiring 30 can be made of metal material. In this case, due to poor adhesion of metal, the widths of the first ground wiring 20 and the second ground wiring 30 can be set to a maximum of 300 to 400 μm. Alternatively, the first ground wiring 20 and the second ground wiring 30 can be made of ITO (Indium Tin Oxide) or IZO (IZO Iridium Zinc Oxide). In this case, the first ground wiring 20 and the second ground wiring 30 can have a width of 1 to 5 mm or even wider.

Thirdly, the touch substrate is used in conjunction with a display device. The first terminal 201 on the first ground wiring 20 is configured to connect the first ground wiring 20 to a ground wiring on the display device, so that the static charges on the first ground wiring 20 can be conducted to the earth. Similarly, the second terminal 301 on the second ground wiring 30 is configured to connect the second ground wiring 30 to the ground wiring on the display device, so that the static charges on the second ground wiring 30 can be conducted to the earth. Based on this, in order not to affect the respective connection of the first terminal 201 and the second terminal 301 to the ground wiring on the display device, the first terminal 201 and the second terminal 301 do not overlap with each other in a direction perpendicular to the base substrate 10.

Fourthly, the first ground wiring 20 and the second ground wiring 30 are disposed in different layers. It can be a case as illustrated in FIG. 1 in which the second ground wiring 30 surrounds the first ground wiring 20 in the direction perpendicular to the base substrate 10, or can be a case as illustrated in FIG. 2 in which the first ground wiring 20 surrounds the second ground wiring 30 in the direction perpendicular to the base substrate 10. Of course, it can be a case in which the second ground wiring 30 and the first ground wiring 20 are partially overlapped in the direction perpendicular to the base substrate 10, as long as the first terminal 201 and the second terminal 301 do not overlap with each other in the direction perpendicular to the base substrate 10.

Fifthly, the first ground wiring 20 or the second ground wiring 30 can be formed at the same time when touch electrodes are formed in the touch area 01, or alternatively, the first ground wiring 20 or the second ground wiring 30 can be formed at the same time when a bridge is formed in the touch area 01. Of course, the first ground wiring 20 and the second ground wiring 30 may not be formed simultaneously with other structures on the touch substrate.

Sixthly, the positions of the first terminal 201 and the second terminal 301 on the touch substrate are not limited in the present disclosure, as long as it can be conveniently connected to the ground wiring in the touch display device.

Seventhly, the material for the base substrate 10 is not limited, and for example, it can be a glass substrate.

In the touch substrate according to at least one embodiment of the present disclosure, the touch substrate not only comprises the first ground wiring 20, but also comprises the second ground wiring 30. The static charges on the touch substrate can either be discharged from the touch substrate through the first ground wiring 20 or be discharged from the touch substrate through the second ground wiring 30. The first ground wiring 20 and the second ground wiring 30 are cooperated with each other, so that more static charges on the touch substrate can be discharged, which improves the antistatic ability of the touch substrate and protects the touch substrate.

In one embodiment according to the present disclosure, the touch electrodes are disposed in the touch area of the base substrate 10, and the second ground wiring 30 is disposed on the same layer as the touch electrodes and is made of the same material as the touch electrodes. That the second ground wiring is disposed on the same layer as the touch electrodes means that the second ground wiring and the touch electrodes are formed through a single patterning process, wherein the single patterning process comprises coating photoresist, exposing the photoresist through a single mask, developing the photoresist, and etching. Depending on the particular pattern in the formed layer structure, a single patterning process can comprise multiple exposures, developments or etching processes, and the specific patterns in the formed layer structure can be continuous or discontinuous, and the specific patterns can be disposed at different heights or have different thicknesses.

The touch electrodes are made of transparent conductive material such as IZO or ITO.

In the embodiments of the present disclosure, the shape and the arrangement of the touch electrodes are not limited, and can be the same as the shape and the arrangement of the touch electrodes on the touch substrate in the conventional art.

In the embodiments according to the present disclosure, the second ground wiring 30 and the touch electrodes are disposed on the same layer and are made of the same material, thus the second ground wiring 30 can be fabricated simultaneously with the touch electrodes, so as to simplify the manufacturing process of the touch substrate without increasing the cost of materials and equipments. Based on this, since the second ground wiring 30 and the touch electrodes are disposed on the same layer and made of the same material, and the touch electrodes are made of transparent conductive material, and the adhesion of the transparent conductive material is better than that of the metal material, the second ground wiring 30 can be formed in a greater width. That the second ground wiring and the touch electrodes are disposed on the same layer means that the second ground wiring and the touch electrodes are formed through a single patterning process, wherein the single patterning process comprises coating photoresist, exposing the photoresist through a single mask, developing the photoresist, and etching. Depending on the particular pattern in the formed layer structure, a single patterning process can comprise multiple exposures, developments or etching processes, and the specific patterns in the formed layer structure can be continuous or discontinuous, and the specific patterns can be disposed at different heights or have different thicknesses.

The smaller the width of the second ground wiring 30 is, the less the static charges that can be discharged by the second ground wiring 30 will be. On the other hand, if the second ground wiring 30 is too wide, the width of the light shielding area 02 has to be set wider accordingly, which is disadvantageous in achieving a narrow frame of the display device. Based on this, in one embodiment of the present disclosure, the second ground wiring 30 has a width of 1 to 5 mm.

It is to be noted that the greater the width of the second ground wiring 30 is, the more the static charges that can be discharged by the second ground wiring 30 will be.

In one embodiment according to the present disclosure, when the width of the second ground wiring 30 is up to 1 to 5 mm, the second ground wiring 30 can discharge the static charges from the touch substrate in a quicker and more significant manner to protect the touch substrate.

In one embodiment of the present disclosure, as illustrated in FIG. 1, an orthogonal projection of the second ground wiring 30 on the base substrate 10 surrounds an orthographic projection of the first ground wiring 20 on the base substrate 10.

The orthogonal projection of the second ground wiring 30 on the base substrate 10 surrounding the orthographic projection of the first ground wiring 20 on the base substrate 10, means that the boundary of the first ground wiring 20 is within the boundary of the second ground wiring 30 in the direction perpendicular to the base substrate 10.

In one embodiment according to the present disclosure, the second ground wiring 30 is made of transparent conductive material, and the width of the second ground wiring 30 can be up to 1 to 5 mm. Based on this, since the second ground wiring 30 is relatively wide, more static charges can be discharged by the second ground wiring 30. By disposing the second ground wiring 30 on the periphery of the first ground wiring 20, the static charges on the touch substrate can be discharged from the second ground wiring 30 at first, thereby preventing the first ground wiring 20 and the touch substrate from being damaged by the static charges. In one embodiment of the present disclosure, the width of the second ground wiring is greater than the width of the first ground wiring.

Figure 3:
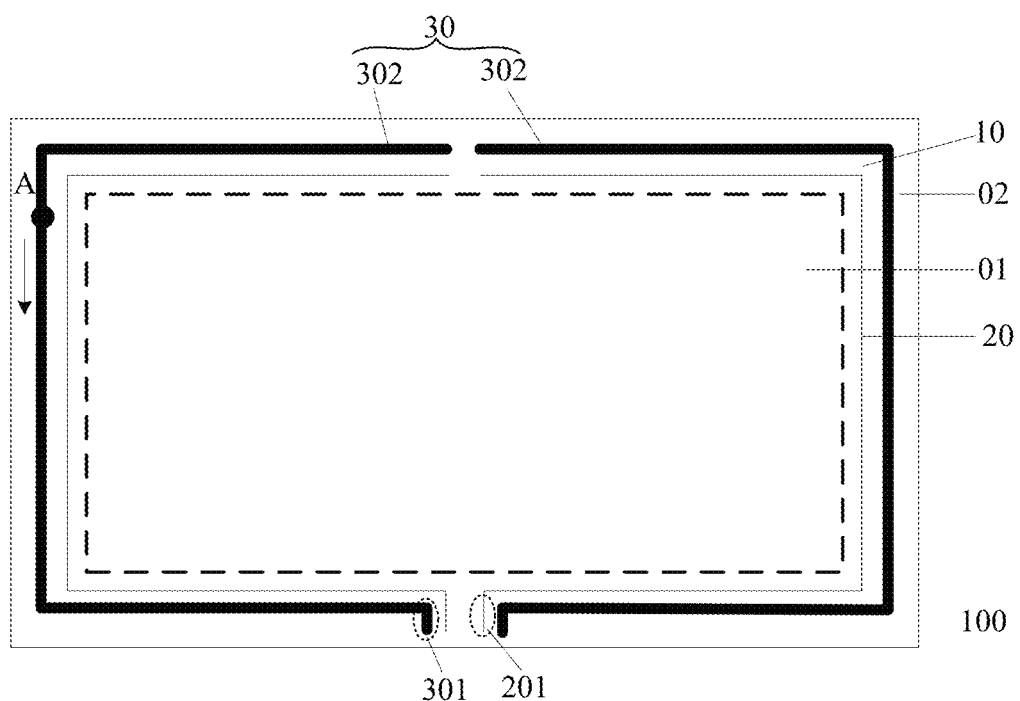
FIG. 3 is an illustrative structural view of two sub-ground wirings included in a second ground wiring of a touch substrate according to one embodiment of the present disclosure.

In one embodiment according to the present disclosure, as illustrated in FIG. 1, when the second ground wiring 30 only comprises one second sub-ground wiring 302 surrounding the touch area 01, the static charges at point A on the touch substrate can be discharged in two possible directions (a clockwise direction or a counterclockwise direction) to the second terminal 301. In another embodiment according to the present disclosure, as illustrated in FIG. 3, the second ground wiring 30 comprises two second sub-ground wirings 302 disconnected from each other, the static charges on the touch substrate will only be discharged in a direction approaching the second terminal 301 at the time of being discharged through the second ground wiring 30. For example, the static charges at point A in FIG. 3 will only be discharged in the counterclockwise direction.

In one embodiment of the present disclosure, as illustrated in FIG. 3, the second ground wiring 30 comprises two second sub-ground wirings 302 that are disconnected from each other. The two second sub-ground wirings 302 surround the touch area 01 together. The static charges generated on the touch substrate is discharged to the closer one of the two second sub-ground wirings 302 and then discharged to the earth through the shortest path.

It should be noted that when the second ground wiring 30 comprises two second sub-ground wirings 302 that are disconnected from each other, each of the second sub-ground wirings 302 should have one second terminal 301.

The materials for the two second sub-ground wirings 302 can be the same or different, and the widths of the two second sub-ground wirings 302 can be the same or different. In addition, the two second sub-ground wirings 302 can be fabricated simultaneously or separately.

Here, the first ground wiring 20 can also comprise two first sub-ground wirings that are disconnected from each other as illustrated in FIG. 3.

In the embodiments according to the present disclosure, the touch substrate comprises two second sub-ground wirings 302. Thus, when the static charges on the touch substrate are discharged, the static charges can be conducted to the second terminal 301 which is closer to the static charges along the two second sub-ground wirings 302, so that the static charges on the touch substrate can be discharged faster.

In one embodiment according to the present disclosure, the second ground wiring 30 is made of transparent conductive material such as IZO or ITO and etc.

In the embodiments according to the present disclosure, the second ground wiring 30 is made of transparent conductive material. Since the material of the touch electrodes is also transparent conductive material, the second ground wiring 30 can be fabricated simultaneously with the touch electrodes. Thus, there is no need to increase the cost of materials, equipments and etc., and the manufacturing process of the touch substrate is simplified. Based on this, compared with metal material, the transparent conductive material has better adhesion, so the width of the second ground wiring 30 made by the transparent conductive material is greater than the width of the second ground wiring 30 made by the metal material. As a result, the static charges on the touch substrate can be discharged in a faster and more significant manner.

Figure 4:
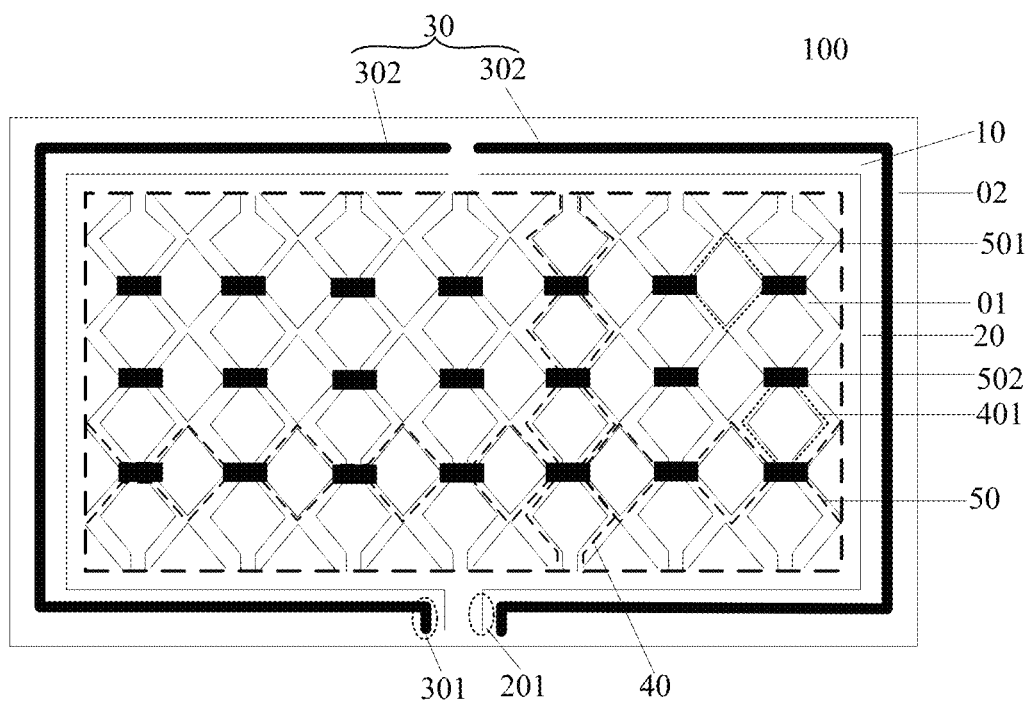
FIG. 4 is an illustrative structural view of a touch substrate according to yet another embodiment of the present disclosure.

In one embodiment according to the present disclosure, as illustrated in FIG. 4, the touch electrodes comprise a first touch electrode 40 and a second touch electrode 50 that cross each other and are insulated from each other. The first touch electrode 40 comprises a plurality of first sub-touch electrodes 401 which are directly connected. The second touch electrode 50 comprises a plurality of second sub-touch electrodes 501 which are arranged in a spaced-apart manner. The second sub-touch electrodes 501 are connected via bridges 502, and the bridges 502 and the first ground wiring 20 are provided on the same layer and made of the same material. That the bridges and the first ground wiring are provided on the same layer means that the bridges and the first ground wiring are formed through a single patterning process, wherein the single patterning process comprises coating photoresist, exposing the photoresist through a single mask, developing the photoresist, and etching. Depending on the particular pattern in the formed layer structure, a single patterning process can comprise multiple exposures, developments or etching processes, and the specific patterns in the formed layer structure can be continuous or discontinuous, and the specific patterns can be disposed at different heights or have different thicknesses.

For example, the first touch electrode 40 is a sensing electrode and the second touch electrode 50 is a driving electrode. Alternatively, the first touch electrode 40 is a driving electrode and the second touch electrode 50 is a sensing electrode. It is not limited in the present disclosure in this regard.

Here, the materials for the bridges 502 and the first ground wiring 20 are not limited, as long as they are conductive. For example, the bridges 502 and the first ground wiring 20 are made of metal materials.

In the embodiments according to the present disclosure, since the bridges 502 and the first ground wiring 20 are disposed on the same layer and are made of the same material, the bridges 502 and the first ground wiring 20 can be simultaneously fabricated, thereby simplifying the manufacturing process of the touch substrate. While fabricating the bridges 502 and the first ground wiring 20, other signal wirings can also be fabricated in the light shielding area 02 of the touch substrate. That the bridges and the first grounding wiring are disposed on the same layer means that the bridges and the first grounding wiring formed through a single patterning process, wherein the single patterning process comprises coating photoresist, exposing the photoresist through a single mask, developing the photoresist, and etching. Depending on the particular pattern in the formed layer structure, a single patterning process can comprise multiple exposures, developments or etching processes, and the specific patterns in the formed layer structure can be continuous or discontinuous, and the specific patterns can be disposed at different heights or have different thicknesses.

At least one embodiment of the present disclosure provides a touch display device comprising the above-described touch substrate.

The touch display device can be a liquid crystal display (abbreviated as LCD), or can be an organic light-emitting diode (abbreviated as OLED). When the touch display device is a liquid crystal display device, the liquid crystal display device comprises a liquid crystal display panel and a backlight module. The liquid crystal display panel comprises an array substrate, a cell-assembled substrate, and a liquid crystal layer disposed between the array substrate and the cell-assembled substrate. The backlight module comprises a backlight source, a diffusion plate, and a light guide plate or the like. When the touch display device is an organic light-emitting diode display device, the touch display device comprises an organic light-emitting diode display panel, which comprises a cathode, an anode, and a light emitting layer.

In the touch display device according to the embodiments of the present disclosure, since the touch display device comprises a touch substrate, which comprises not only the first ground wiring 20 but also the second ground wiring 30, the static charges in the touch display device can be either discharged from the touch substrate through the first ground wiring 20, or discharged from the touch substrate through the second ground wiring 30. The first ground wiring 20 and the second ground wiring 30 work together, so that more static charges on the touch display device can be discharged, and the antistatic ability of the touch display device is improved so as to protect the touch display device.

In one embodiment according to the present disclosure, as illustrated in FIG. 5, the touch display device comprises a touch substrate 100 and a display panel 200. The touch substrate 100 is incorporated into the display panel 100. A third ground wiring 400 is provided on the display panel. The second terminal 301 of the second ground wiring 30 is connected to the third ground wiring 400 through a flexible printed circuit 410 (abbreviated as FPC). In addition, the first terminal 201 of the first ground wiring 20 can also be connected to the third ground wiring 400 through the FPC 410.

Since the third ground wiring on the display panel is connected to the earth, the static charges conducted to the second ground wiring 30 in the touch display device can be conducted to the earth through the third ground wiring 400, thereby avoiding the influence of static charges on the touch display device. Since the third ground wiring 400 is also connected to the first ground wiring 20, the static charges on the first ground wiring 20 can be conducted to the earth through the third ground wiring 400, so as to prevent the static charges on the first ground wiring 20 from affecting the touch display device.

Based on the above, it should be noted that since the third ground wiring 400 is finally connected with the entire system of the touch display device so as to conduct the static charges to the earth, the second terminal 301 can also be directly connected to the entire system through a conductive tape so as to conduct the static charges to the earth.

Figure 7:
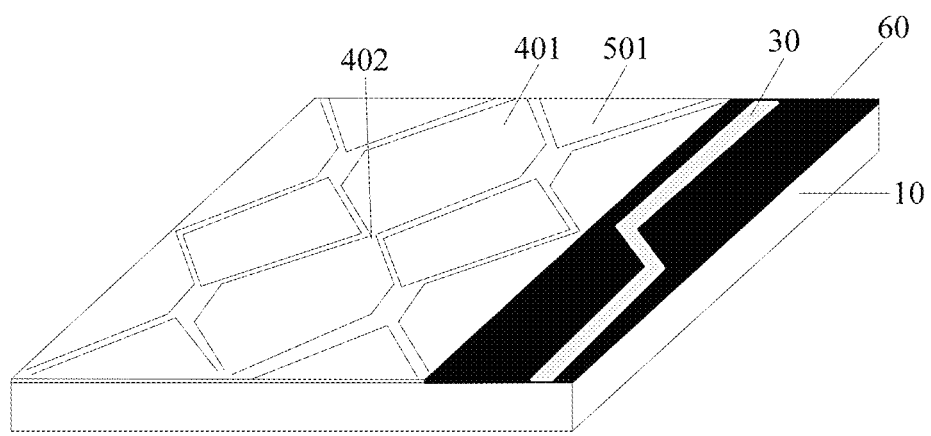
FIG. 7 is an illustrative structural view of forming a touch electrode and a second ground wiring on a base substrate according to one embodiment of the present disclosure.

At least one embodiment of the present disclosure further provides a method for manufacturing the above-described touch substrate, as illustrated in FIG. 6, comprising:

S100: as illustrated in FIG. 7, forming a first conductive layer on a base substrate 10, patterning the first conductive layer to form touch electrodes in a touch area 01, and forming a second ground wiring 30 in a light shielding area 02; the touch electrodes comprising a first touch electrode 40 and a second touch electrode 50 that cross each other and are insulated from each other, the first touch electrode 40 comprising a plurality of first sub-touch electrodes 401 which are directly connected, and the second touch electrode 50 comprising a plurality of second sub-touch electrodes 501 which are arranged in a spaced-apart manner.

It should be noted that before the step of S100 is performed, as illustrated in FIG. 7, the method for manufacturing the touch substrate further comprises forming a light shielding pattern 60 in the light shielding area 02. The light shielding pattern 60 is made of a light-shielding and insulating material, such as black resin.

The material for the first conductive layer is not limited, as long as it is transparent conductive material, such as IZO or ITO.

Here, patterning the first conductive layer comprises steps of exposing, developing and etching the first conductive layer or the like.

Figure 8:
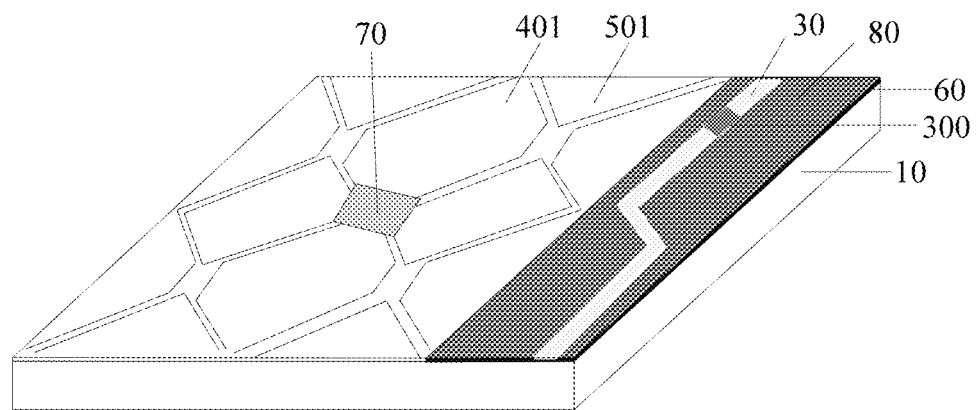
FIG. 8 is an illustrative structural view of forming a first insulating pattern and a second insulating pattern according to one embodiment of the present disclosure.

S101: as illustrated in FIG. 8, forming a first insulating film, patterning the first insulating film to form a first insulating pattern 70 between adjacent second sub-touch electrodes 501 and forming a second insulating pattern 80 in the light-shielding area 02, wherein the first insulating pattern 70 covers a connecting portion 402 between adjacent first sub-touch electrodes, the second insulating pattern 80 comprises a first hollow portion 300 to expose a portion of the second ground wiring 30 so as to form a second terminal 301 of the second ground wiring 30.

The material for the first insulating film is not limited, and can be for example silicon nitride, silicon oxide, or silicon carbonitride, and etc.

Here, patterning the first insulating film comprises the steps of exposing and developing the first insulating film or the like.

Figure 9:
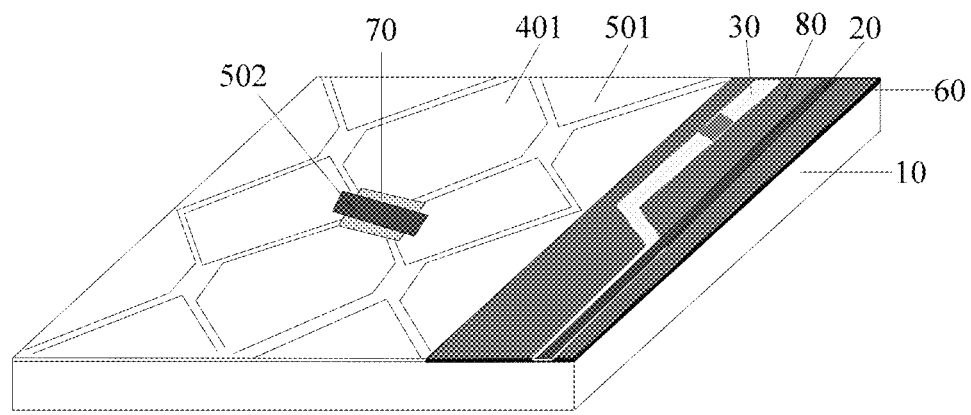
FIG. 9 is an illustrative structural view of forming a bridge on the first insulating pattern and forming a first ground wiring in a light shielding area according to one embodiment of the present disclosure.

S102: as illustrated in FIG. 9, forming a second conductive layer, and patterning the second conductive layer so as to form bridges 502 for connecting adjacent second sub-touch electrodes 501 on the first insulating pattern 70, and forming a first ground wiring 20 on the light shielding area 02 and expose a second terminal 301.

The material for the second conductive layer is not limited and can be metal material. For example, it can be Cu (copper), Al (aluminum), Ag (silver), or the like.

Here, patterning the second conductive layer comprises the steps of exposing, developing and etching the second conductive layer and the like.

It should be noted that other signal wirings (not illustrated in FIG. 9) can also be formed in the light shielding area 02 while the second conductive layer is patterned to form the bridges 502 and the first ground wiring 20.

Figure 10:
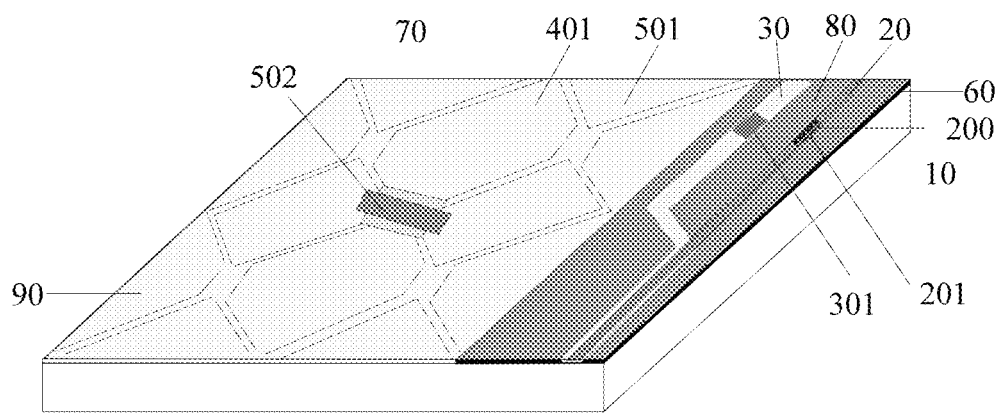
FIG. 10 is an illustrative structural view of forming a second insulating film according to one embodiment of the present disclosure.

S103, as illustrated in FIG. 10, forming a second insulating film 90, and patterning the second insulating film 90 to form a second hollow portion in the light shielding area 02, exposing the second terminal 301 from the surface of the touch substrate, and exposing a portion of the first ground wiring 20 from the surface of the touch substrate to form the first terminal 201 of the first ground wiring 20; wherein the first terminal 201 and the second terminal 301 do not overlap with each other in a direction perpendicular to the touch substrate.

The material for the second insulating film 90 is not limited, and the material for the second insulating film 90 can be the same as or different from that of the first insulating film.

Here, patterning the second insulating film 90 comprises the steps of exposing and developing the second insulating film 90 and the like.

In addition, the positions of the first terminal 201 and the second terminal 301 on the touch substrate are not limited, as long as they are conveniently connected to the ground wiring in the touch display device.

The embodiments of the present disclosure provide a method for manufacturing a touch substrate. Since the touch substrate comprises not only the first ground wiring 20 but also the second ground wiring 30, the static charges on the touch substrate can be discharged from the touch substrate through either the first ground wiring 20 or be discharged from the touch substrate through the second ground wiring 30. The first ground wiring 20 and the second ground wiring 30 are combined, so that more static charges on the touch substrate can be discharged, which improves the antistatic ability of the touch substrate to protect the touch substrate. Based on this, since the touch electrodes and the second ground wiring 30 are formed at the same time, the manufacturing process of the touch substrate is simplified and the production efficiency is improved.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201611093958.5 filed on Dec. 1, 2016, the disclosure of which is hereby entirely incorporated by reference as a part of the present disclosure.

The invention claimed is:

1. A touch substrate, comprising a base substrate which comprises a touch area and a light shielding area surrounding the touch area; and a first ground wiring disposed in the light shielding area of the base substrate, the first ground wiring comprising a first terminal exposed on a surface of the touch substrate;

wherein the touch substrate further comprises a second ground wiring disposed in the light shielding area and in a different layer from the first ground wiring; the second ground wiring comprises a second terminal exposed on the surface of the touch substrate; and wherein the first terminal and the second terminal do not overlap with each other in a direction perpendicular to the base substrate.

2. The touch substrate according to claim 1, wherein touch electrodes are provided in the touch area of the base substrate, the second ground wiring and the touch electrodes are disposed on a same layer and are made of a same material.

3. The touch substrate according to claim 2, wherein the touch electrodes comprise a first touch electrode and a second touch electrode that cross each other and are insulated from each other;

the first touch electrode comprises a plurality of first sub-touch electrodes which are directly connected, the second touch electrode comprises a plurality of second sub-touch electrodes which are arranged in a spaced-apart manner, and the second sub-touch electrodes are connected via bridges; and the bridges and the first ground wiring are disposed on a same layer and are made of a same material.

4. The touch substrate according to claim 1, wherein an orthogonal projection of the second ground wiring on the base substrate surrounds an orthographic projection of the first ground wiring on the base substrate.

5. The touch substrate according to claim 4, wherein the second ground wiring has a width greater than that of the first ground wiring.

6. The touch substrate according to claim 5, wherein the second ground wiring has a width of 1 to 5 mm.

7. The touch substrate according to claim 1, wherein the second ground wiring comprises two second sub-ground wirings which are disconnected from each other; and the two second sub-ground wirings surround the touch area together.

8. The touch substrate according to claim 1, wherein the second ground wiring is made of transparent conductive material.

9. A touch display device, comprising the touch substrate according to claim 1.

10. The touch display device according to claim 9, wherein the touch display device comprises a third ground wiring, and the second terminal in the touch substrate is connected to the third ground wiring through a flexible printed circuit.

11. The touch display device according to claim 9, wherein the touch display device comprises a third ground wiring, and the first terminal in the touch substrate is connected to the third ground wiring through a flexible printed circuit.

12. A manufacturing method of a touch substrate which comprises a touch area and a light shielding area surrounding the touch area, comprising:

forming a first conductive layer on a base substrate, patterning the first conductive layer to form touch electrodes in the touch area, and to form a second ground wiring in the light shielding area; the touch electrodes comprising a first touch electrode and a second touch electrode that cross with each other and are insulated from each other, the first touch electrode comprising a plurality of first sub-touch electrodes which are directly connected, and the second touch electrode comprising a plurality of second sub-touch electrodes which are arranged in a spaced-apart manner;

forming a first insulating film, patterning the first insulating film to form a first insulating pattern between adjacent second sub-touch electrodes, and to form a second insulating pattern in the light shielding area, wherein the first insulating pattern covers a connecting portion between adjacent first sub-touch electrodes, the second insulating pattern comprises a first hollow portion to expose a portion of the second ground wiring to form a second terminal of the second ground wiring;

forming a second conductive layer, patterning the second conductive layer to form bridges for connecting adjacent second sub-touch electrodes on the first insulating pattern, and to form a first ground wiring on the light shielding area to expose the second terminal; and forming a second insulating film, patterning the second insulating film to form a second hollow portion in the light shielding area exposing the second terminal from a surface of the touch substrate and exposing a portion of the first ground wiring from the surface of the touch substrate to form a first terminal of the first ground wiring, wherein the first terminal and the second terminal do not overlap with each other in a direction perpendicular to the touch substrate.

13. The touch substrate according to claim 2, wherein an orthogonal projection of the second ground wiring on the base substrate surrounds an orthographic projection of the first ground wiring on the base substrate.

14. The touch substrate according to claim 13, wherein the second ground wiring has a width greater than that of the first ground wiring.

15. The touch substrate according to claim 14, wherein the second ground wiring has a width of 1 to 5 mm.

16. The touch substrate according to claim 3, wherein an orthogonal projection of the second ground wiring on the base substrate surrounds an orthographic projection of the first ground wiring on the base substrate.

17. The touch substrate according to claim 16, wherein the second ground wiring has a width greater than that of the first ground wiring.

18. The touch substrate according to claim 17, wherein the second ground wiring has a width of 1 to 5 mm.

19. The touch substrate according to claim 2, wherein the second ground wiring comprises two second sub-ground wirings which are disconnected from each other; and the two second sub-ground wirings surround the touch area together.

20. The touch substrate according to claim 2, wherein the second ground wiring is made of transparent conductive material.

* * * * *